US011270861B1

(12) United States Patent
Johler et al.

(10) Patent No.: US 11,270,861 B1
(45) Date of Patent: Mar. 8, 2022

(54) PROTECTION DEVICE INCLUDING RADIAL LEAD FUSE

(71) Applicant: Littelfuse, Inc., Chicago, IL (US)

(72) Inventors: Werner Johler, Chicago, IL (US);
Arnel Ramos, Cabuyao (PH); Conrado Sagun De Leon, Calamba (PH);
Joshua Miles Felicilda, Batangas (PH)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/038,962

(22) Filed: Sep. 30, 2020

(51) Int. Cl.
| *H01H 85/175* | (2006.01) |
| *H01H 85/20* | (2006.01) |
| *H01H 85/10* | (2006.01) |
| *H01H 69/02* | (2006.01) |
| *H01H 85/165* | (2006.01) |
| *H01H 37/76* | (2006.01) |
| *H01H 85/02* | (2006.01) |

(52) U.S. Cl.
CPC ........ *H01H 85/1755* (2013.01); *H01H 69/02* (2013.01); *H01H 85/10* (2013.01); *H01H 85/165* (2013.01); *H01H 85/175* (2013.01); *H01H 85/205* (2013.01); *H01H 85/2045* (2013.01); *H01H 37/761* (2013.01); *H01H 2085/0275* (2013.01); *H01H 2085/2085* (2013.01); *H05K 2201/10181* (2013.01)

(58) Field of Classification Search
CPC ...... H01H 37/761; H01H 69/02; H01H 85/10; H01H 85/2045; H01H 85/205; H01H 2085/0275; H01H 2085/2085; H01H 85/165; H01H 85/175; H01H 85/1755; H05K 2201/10181
See application file for complete search history.

(56) References Cited

U.S. PATENT DOCUMENTS

| 5,854,583 A | * | 12/1998 | Falchetti | H01H 85/044 337/290 |
| 10,553,387 B1 | * | 2/2020 | Angelini | H01H 85/38 |
| 2001/0026209 A1 | * | 10/2001 | Kondo | H01H 85/0417 337/260 |
| 2001/0026210 A1 | * | 10/2001 | Endo | H01H 85/0417 337/260 |
| 2015/0295396 A1 | * | 10/2015 | Yang | H05K 1/181 361/93.1 |
| 2018/0114663 A1 | * | 4/2018 | Possnicker | H01H 85/0418 |

(Continued)

*Primary Examiner* — Jacob R Crum
(74) *Attorney, Agent, or Firm* — Kacvinsky Daisak Bluni PLLC

(57) ABSTRACT

Disclosed are various protection devices and associated methods. In some embodiments, a protection device may include a fuse assembly having a fusible link extending between a first lead end and a second lead end, and a first lead extending from the first lead end and a second lead extending from the second lead end. The protection device may further include a body including a first section coupleable with a second section, wherein the first and second sections define a central cavity housing the fusible link. The first section may include an interior face operable to engage an opposite interior face of the second section, an engagement member extending away from the interior face towards the second section, and an engagement channel adjacent the engagement member, the engagement channel operable to receive a corresponding engagement member of the second section.

15 Claims, 17 Drawing Sheets

(56) References Cited

U.S. PATENT DOCUMENTS

2018/0138004 A1* 5/2018 Schlaak ............... H01H 85/165
2018/0151322 A1* 5/2018 Lin ....................... H01H 85/56
2019/0214213 A1* 7/2019 Siegwald ............. H01H 85/165

* cited by examiner

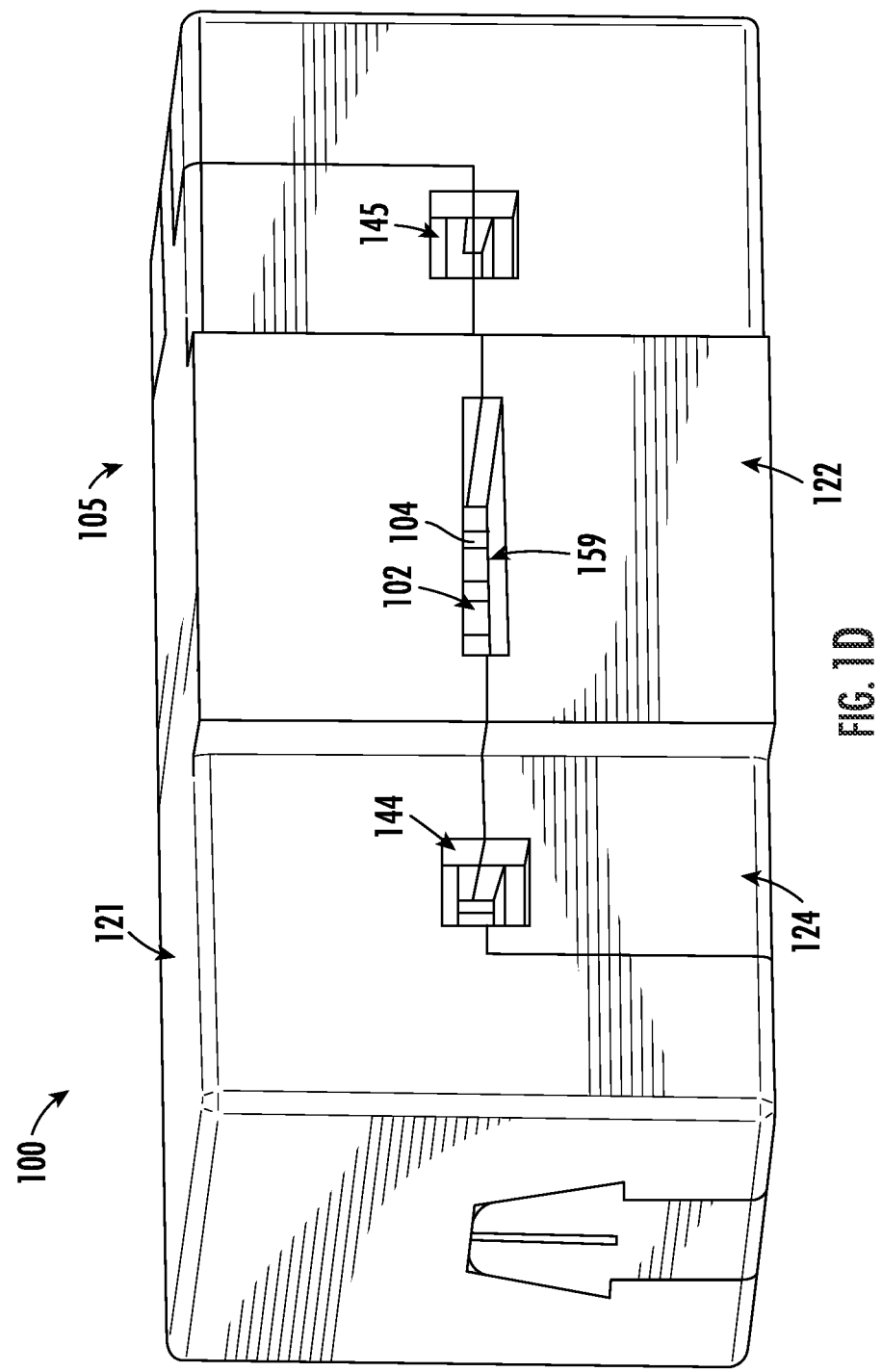

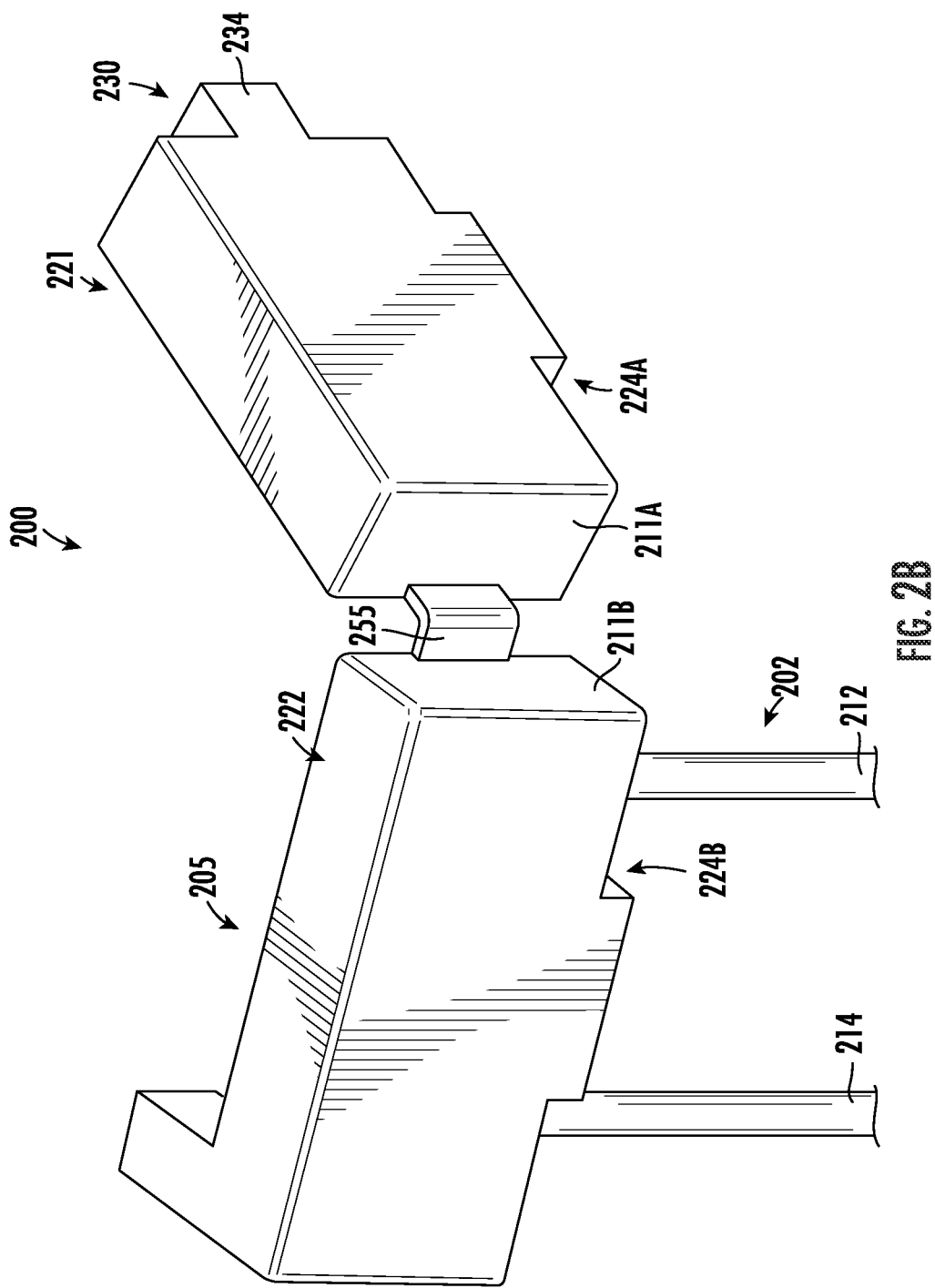

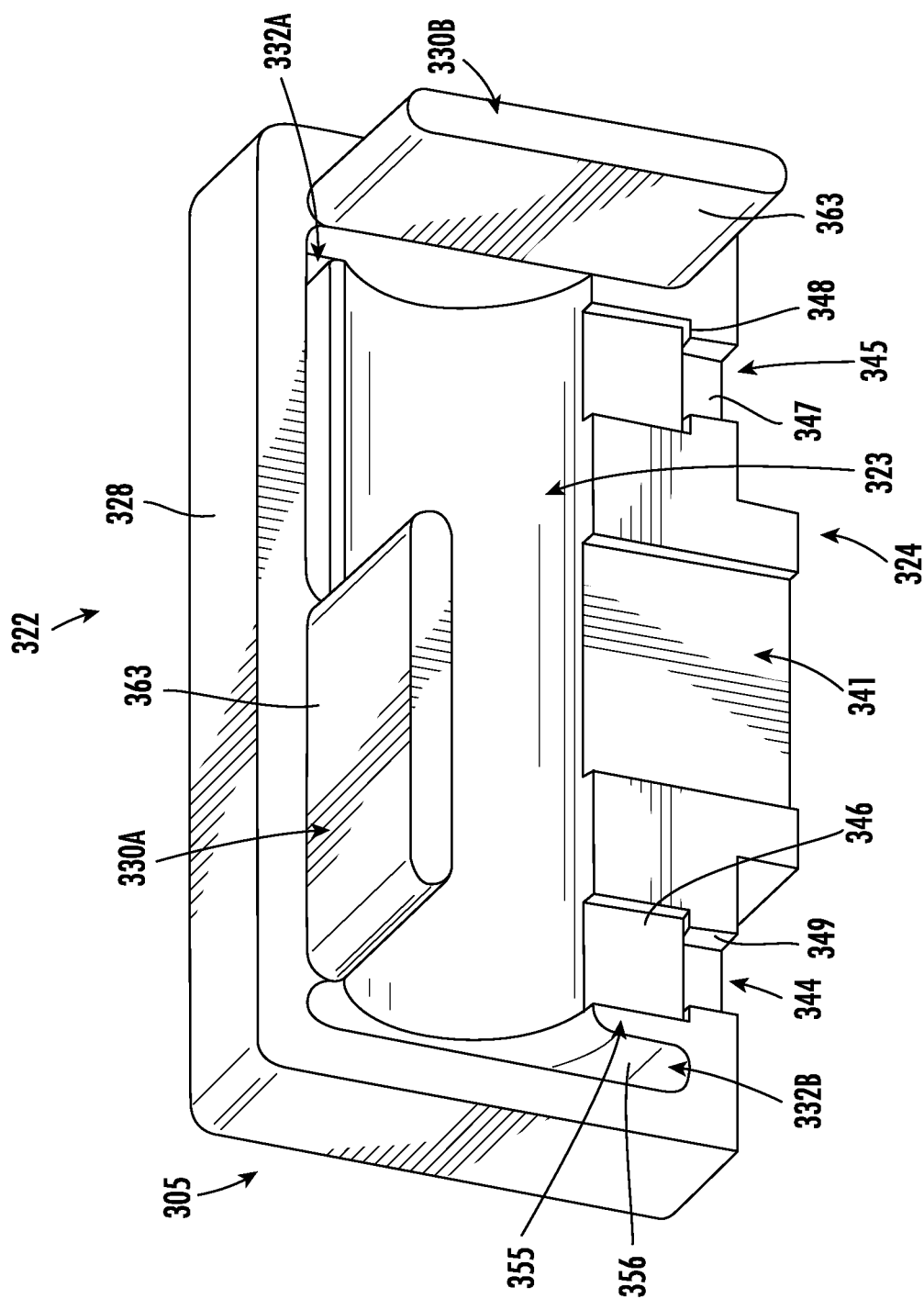

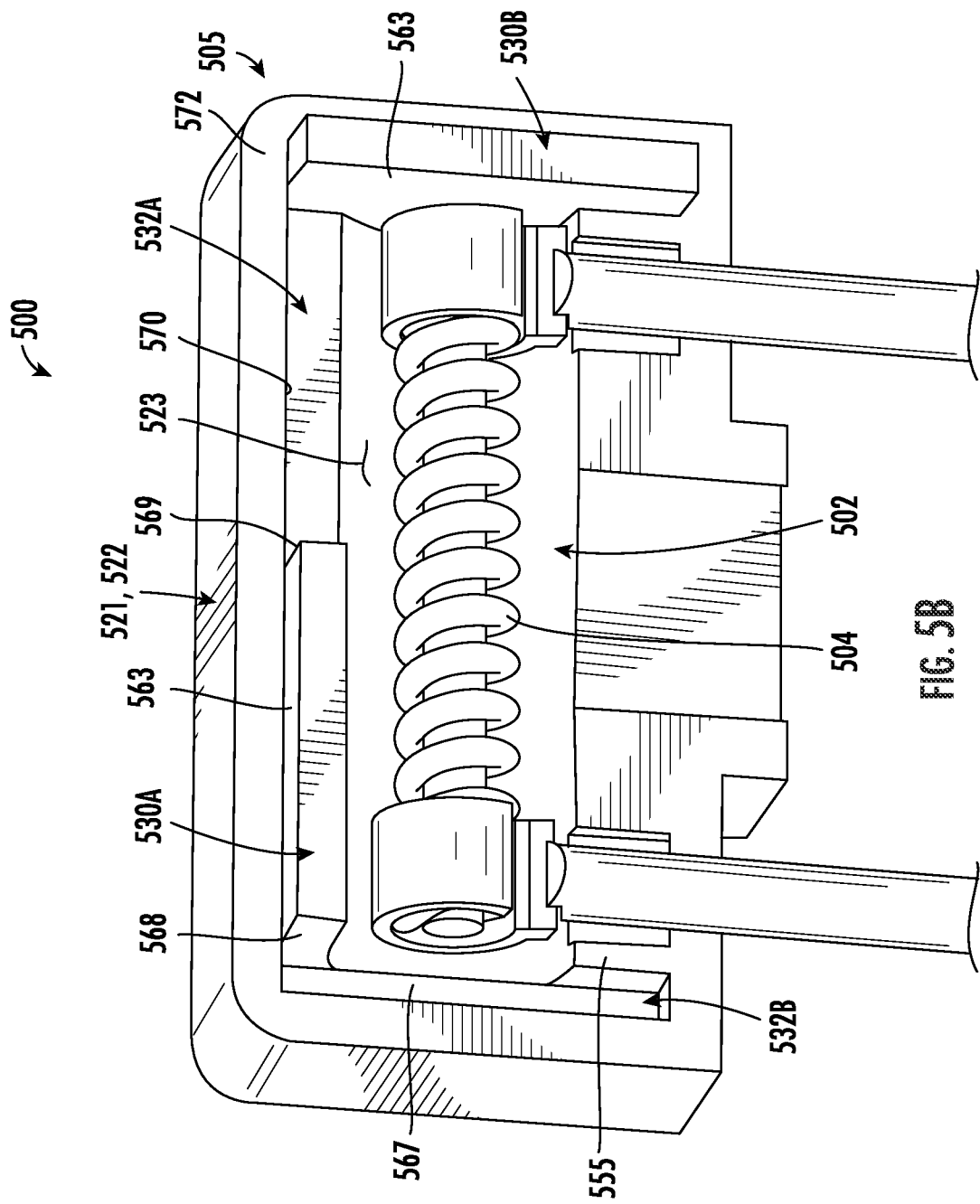

PROTECTION DEVICE INCLUDING RADIAL LEAD FUSE

FIELD OF THE DISCLOSURE

The present disclosure is generally related to the field of protection devices. More particularly, embodiments of the present disclosure relate to protection devices for radial lead fuses.

BACKGROUND OF THE DISCLOSURE

Electrical fuses are widely used overcurrent protection devices for electrical circuits. Typically, electrical fuses include a fusible link or fuse element assembly extending between conductive elements that may be connected to circuitry. When installed in an energized electrical circuit, current flows through the fusible link. The fusible link is designed to physically melt, disintegrate, or otherwise structurally fail when the current flowing through the fuse reaches a predetermined level, thereby opening the electrical circuit through the fuse and protecting associated electrical equipment and components from damage. Once the fusible link has opened the circuit, the fuse may be removed and replaced with another fuse to once again complete the circuit.

Existing radial fuses often include a nonconductive body and a pair of axial leads extending from the body for connection to a circuit board. Such radial fuses are used to protect power supplies, power adapters, and battery chargers for a variety of electronic devices. Radial fuses are sometimes preferred for circuit board application because of their smaller size or footprint when installed to a circuit board. Existing body designs include molded cap and socket parts.

There is a need, however, for an improved mold body, wherein simplified/lesser mold tooling is needed, as well as a lesser bill of material and production, to bring down the material and labor cost.

SUMMARY OF THE DISCLOSURE

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

In one approach, a protection device may include a fuse assembly having a fusible link extending between a first lead end and a second lead end, and a first lead extending from the first lead end and a second lead extending from the second lead end. The protection device may further include a body including a first section coupleable with a second section, wherein the first and second sections define a central cavity housing the fusible link. The first section may include an interior face operable to engage an opposite interior face of the second section, an engagement member extending away from the interior face towards the second section, and an engagement channel adjacent the engagement member, the engagement channel operable to receive a corresponding engagement member of the second section.

In another approach, a protection device body may include a first section and a second section couplable to the first section, wherein the first and second sections define a central cavity housing a fusible link of a fuse assembly. The first section may include an interior face operable to engage an opposite interior face of the second section, an engagement member extending away from the interior face towards the second section, and an engagement channel adjacent the engagement member, the engagement channel operable to receive a corresponding engagement member of the second section.

In yet another approach, a method may include housing a fuse assembly within a central cavity of a body, the fuse assembly including a fusible link extending between a first lead end and a second lead end, and a first lead extending from the first lead end and a second lead extending from the second lead end. The method may further include coupling together a first section and a second section of the body, wherein the first and second sections define the central cavity, wherein an interior face of the first section is engaged with an opposite interior face of the second section, wherein a first section engagement member of the first section extends within a second section engagement channel of the second section, and wherein a second section engagement member of the second section extends within a first section engagement channel of the first section.

BRIEF DESCRIPTION OF THE DRAWINGS

The accompanying drawings illustrate exemplary approaches of the disclosed embodiments so far devised for the practical application of the principles thereof, and wherein:

FIG. 1D depicts another perspective view of the protection device of FIG. 1A according to embodiments of the present disclosure;

FIG. 2B depicts another perspective view of the protection device of FIG. 2A according to embodiments of the present disclosure;

FIG. 3C depicts a perspective view of one section of a body of the protection device of FIG. 3A according to embodiments of the present disclosure;

FIG. 5B depicts a perspective view of a portion of the protection device of FIG. 5A according to embodiments of the present disclosure;

Figure 1A:
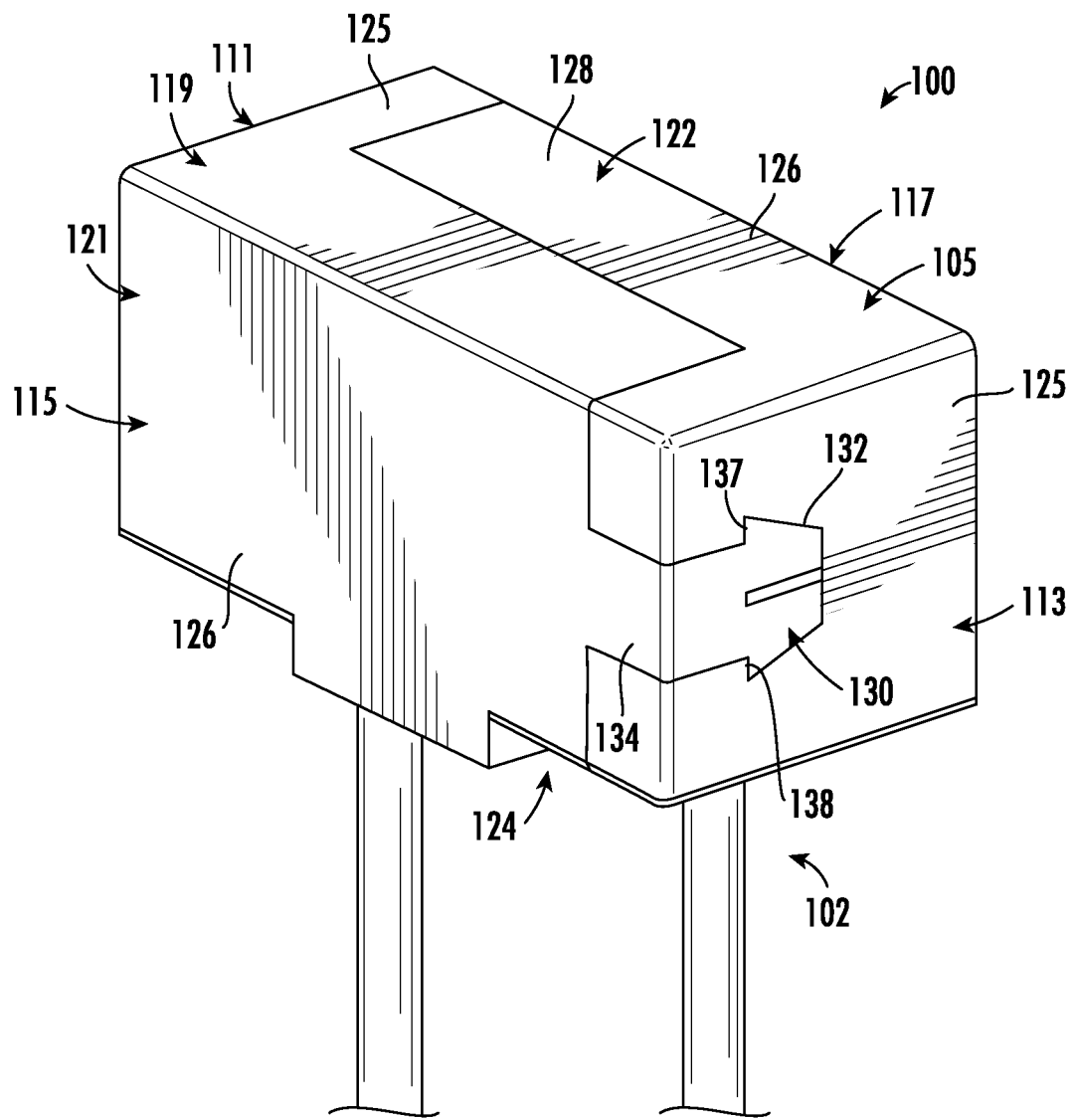
FIG. 1A depicts a perspective view of a protection device according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Protection devices, fuse assemblies, and methods in accordance with the present disclosure will now be described more fully hereinafter with reference to the accompanying drawings, where embodiments are shown. The protection devices, fuse assemblies, and methods may be embodied in many different forms and are not to be construed as being limited to the embodiments set forth herein. Instead, these embodiments are provided so the disclosure will be thorough and complete, and will fully convey the scope of the disclosure to those skilled in the art.

Figure 1B:
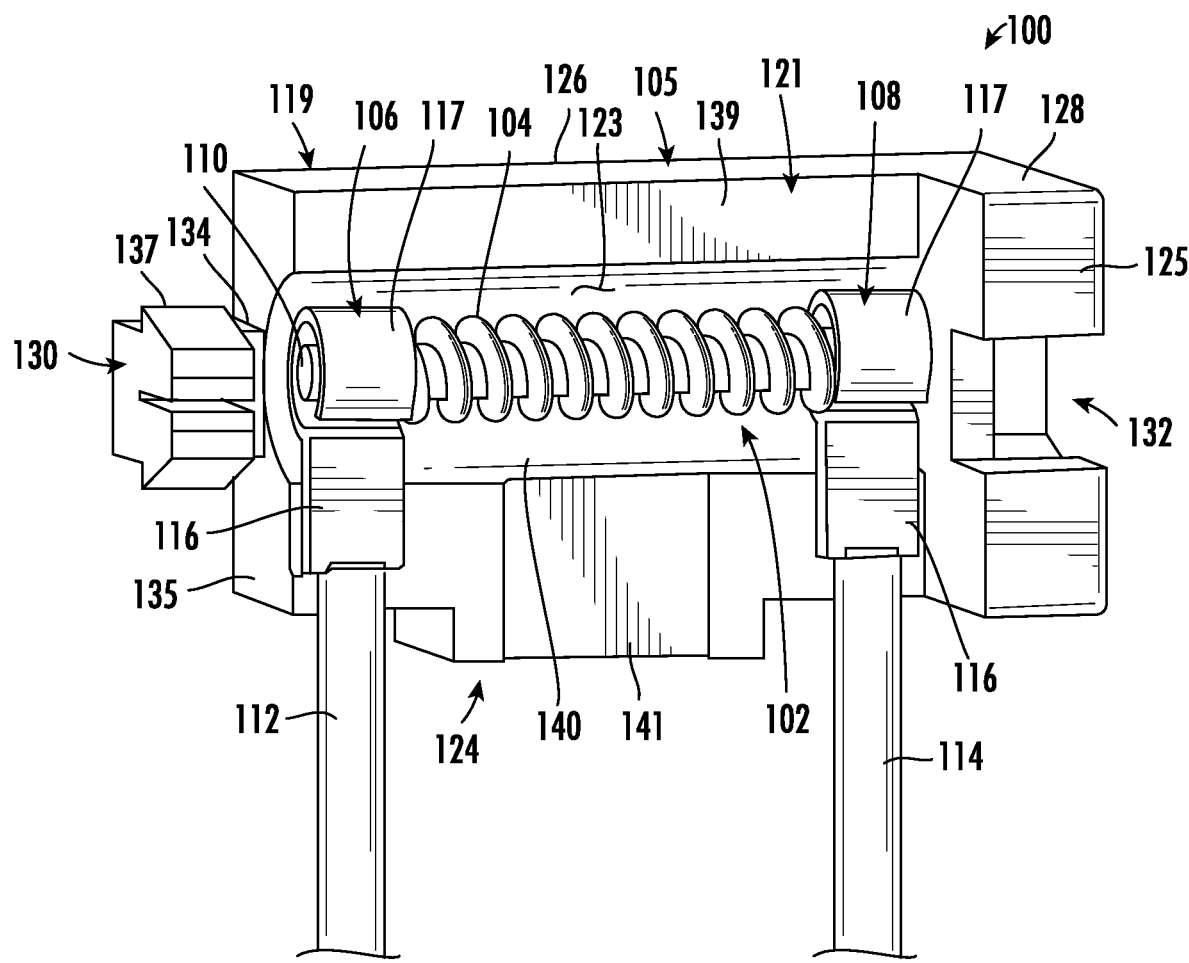
FIG. 1B depicts a perspective view of a portion of the protection device of FIG. 1A according to embodiments of the present disclosure.

FIGS. 1A-1B depict a protection device (hereinafter "device") 100 according to embodiments of the present disclosure. As shown, the device 100 may include a fuse assembly 102 partially enclosed within a body 105, the fuse assembly 102 including a fusible link 104 extending between a first lead end 106 and a second lead end 108. In some embodiments, the fusible link 104 may be helical element extending around a center rod 110. A first end of the fusible link 104 may be in direct physical and electrical contact with the first lead end 106, while a second end of the fusible link 104 may be in direct physical and electrical contact with the second lead end 108. A first lead 112 may extend from the first lead end 106 and a second lead 114 may extend from the second lead end 108.

In some embodiments, the first and second leads 112, 114 may be conductive wire elements, stamped and formed metal elements, or a combination of both. Each of the first and second leads 112, 114 extends for a predetermined length between a proximal end, connected to respective first lead end 106 and second lead end 108, and an opposing distal end. The fusible link 104 may extend generally transverse to the first and second leads 112, 114. Alternatively stated, the fusible link 104 interconnects the first and second leads 112, 114 in a substantially U-shaped arrangement. Embodiments herein are not limited in this context, however.

In some embodiments, the first and second lead ends 106, 108 may include a planar section 116 and a curved section 117, which is bent or otherwise shaped into a rounded eyelet shape into which the fusible link 104 and the center rod 110 may be fitted. Optionally, once the fusible link 104 is inserted into each curved section 117, the ends may be bent further around the first and second ends of the fusible link 104 such that the fusible link 104 is positively captured or secured to the first and second lead ends 106, 108. The fusible link 104 and the first and second lead ends 106, 108 may then be soldered together to complete a mechanical and electrical connection therebetween. As such, a current path is created through the fuse assembly 102 wherein current may flow from a line side connection of a circuit board to a load side connection of the circuit board when the leads 112, 114 are terminated to the circuit board and the circuit is energized.

In accordance with known electrical fuses, the fusible link 104 is constructed to melt, vaporize, disintegrate or otherwise structurally fail when a predetermined magnitude of electrical current flows through the fuse for a duration of time, sometimes referred to as an overcurrent condition, that may damage sensitive electronic components. That is, the current path through the fuse assembly 102 is designed to fail and open the current path through the fusible link 104 to avoid damage to sensitive circuit components. The amount of current that the fusible link 104 may sustain before opening the current path may vary depending on its particular material properties and dimensional aspects. Various fuse link or fuse element constructions are known for such a purpose. While in the embodiment illustrated, the fusible link 104 is a helically or spirally wound fuse element, it is contemplated that other types of fuse elements may be utilized in other embodiments. Once the fusible link 104 is opened, the fuse assembly 102 may be replaced to restore the electrical circuitry to full operation.

As further shown, the body 105 of the device 100 may include a first section 121 coupleable with a second section 122, wherein the first and second sections 121, 122 define a central cavity 123 housing the fusible link 104. In exemplary embodiments, the first and second sections 121, 122 may be identically/symmetrically shaped and configured to decrease machine and part complexity and cost. Although non-limiting, each of the first and second sections 121, 122 may generally be L-shaped, with a first portion 125 extending perpendicular to a second portion 126. Once joined together, the first and second sections 121, 122 may form one or more planar exterior surfaces 128.

The first and second sections 121, 122 may each be fabricated from an injection molded, non-conductive material, such as plastic, into the shapes illustrated or other shapes, as desired. Once joined, the body 105 may generally include a first end 111 opposite a second end 113, a first side 115 opposite a second side 117, and a top side 119 opposite a bottom side 124. As shown, the leads 112, 114 may extend through the bottom side 124 of the body 105.

In the embodiment shown, each of the first and second sections 121, 122 may include an engagement member 130 receivable within a corresponding engagement channel 132 of the opposite section. The opening of the engagement channel 132 may be sized and dimensioned to receive the engagement member 130 therein. More specifically, the engagement channel 132 may be shaped in a generally complementary manner with the outer surfaces of the engagement member 130. For example, the engagement member 130 may include a snap-fit attachment feature, latching feature, or other attachment features and techniques including, but not limited to, adhesives and other elements known in the art to provide secure attachment between the first and second sections 121, 122 once assembled.

Figure 1C:
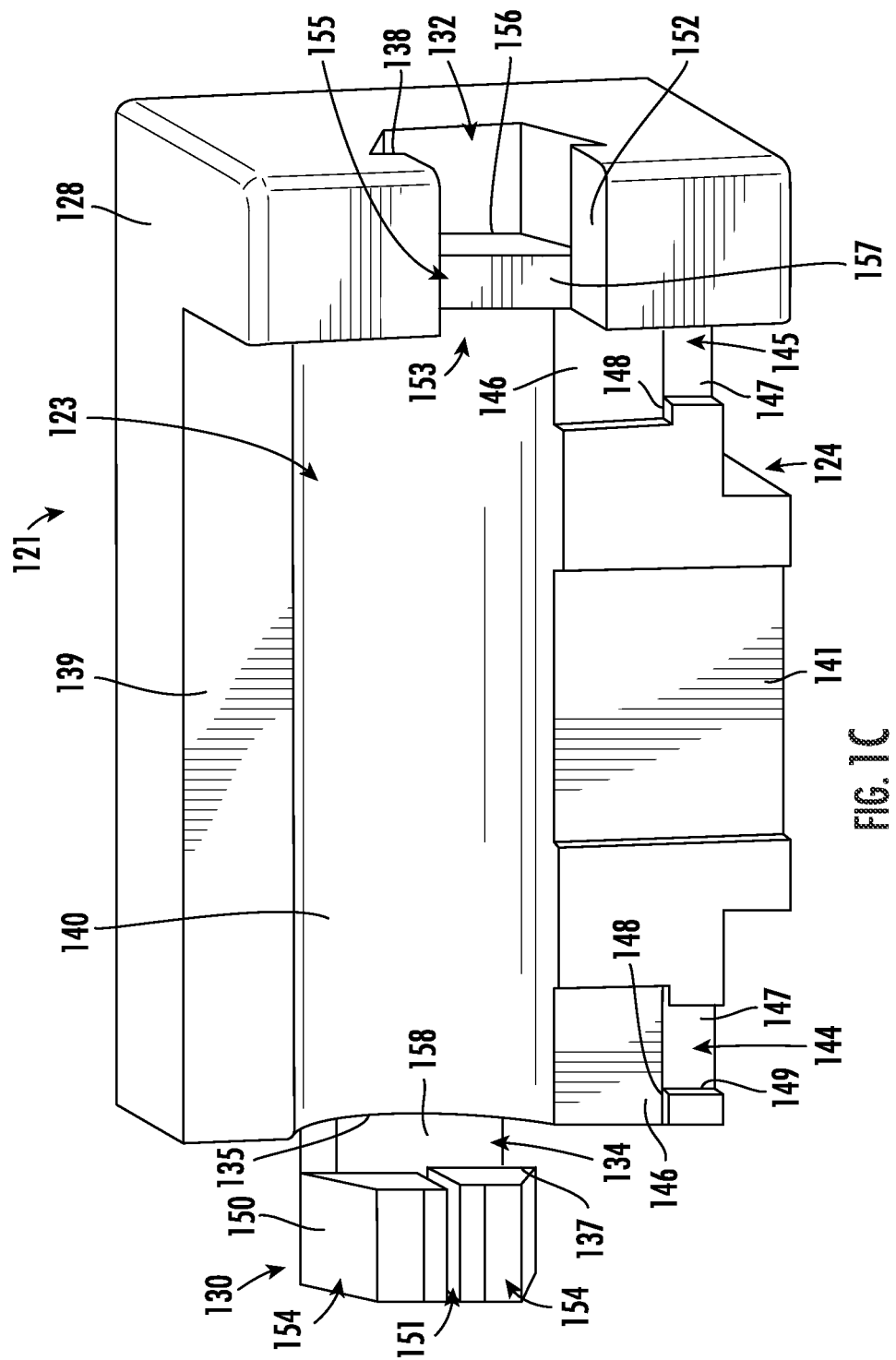
FIG. 1C depicts a perspective view of one section of a body of the protection device of FIG. 1A according to embodiments of the present disclosure.

Referring to FIGS. 1B and 1C, the first section 121 will be described in greater detail. It will be appreciated that the features and descriptions may equally apply to the second section 122, as the first and second sections 121, 122 have identical constructions in the present embodiment. As shown, the engagement member 130 may include an arm 134 extending from an inner side wall 135 of the body 105.

As shown, the engagement member 130 may be a locking tab and the engagement channel 132 may be a locking cavity operable to retain the locking tab therein once joined. For example, the engagement member 130 may include a locking surface 137 operable to abut/engage a retention surface 138 of the engagement channel 132 to prevent the first and second sections 121, 122 from separating.

The first section 121 may further include an interior face 139 operable to engage a corresponding/opposite interior face of the second section 122. A cavity surface 140 may partially define the central cavity 123, which houses portions of the fuse assembly 102. A vent recess 141 connects the central cavity 123 with the exterior surface 128 of the first section 121, e.g., along the bottom side 124.

As best shown in FIG. 1C, the first section 121 may further include a first lead channel 144 and a second lead channel 145 each extending between the central cavity 123 and the exterior surface 128. Although non-limiting, each of the first and second lead channels 144, 145 may be defined in part by a main cavity surface 146, which is connected with a through cavity surface 147. When the fuse assembly 102 is engaged by the body 105, the main cavity surface 146 may be engaged with the planar section 116 of the first lead end 106 and the second lead end 108, respectively, and the through cavity surface 147 may be engaged with an outer surface of the first lead 112 and the second lead 114, respectively. A support shelf 148 of the first and second lead channels 144, 145 may engage a lower edge or surface of the planar section 116 of the first and second lead ends 106, 108. One or more sidewalls 149 adjacent the through cavity surface 147 may provide lateral support for the first and second leads 112, 114.

In some embodiments, a free end of the engagement member 130 may include a set of compression members 154 separated by a slit, wherein each of the set of compression members 154 includes a sloped surface 150 to facilitate initial entry into the engagement channel 132. For example, the sloped surfaces 150 may engage internal surface(s) 152 of an entrance channel 153, causing the slit 151 to narrow as the set of compression members 154 move closer to one another. Once the free end of the engagement member 130 moves past the retention surface 138, the set of compression members 154 are no longer in contact with the internal surfaces 152 of the entrance channel 153, and thus are free to expand due to the increased height/area of the closed end of the engagement channel 132.

The engagement channel 132 may be further defined by a channel wall 155, which generally separates the engagement channel 132 from the internal cavity 123. In some embodiments, the channel wall 155 may include a first channel wall surface 156 in abutment/contact with the engagement member 130, and a second channel wall surface 157 in abutment/contact with an inner surface 158 of the arm 134 of the engagement member 130.

As shown in FIG. 1D, once the first and second sections 121, 122 are coupled together, a thermal vent 159 may be provided to the internal cavity 123, e.g., through the bottom side 124 of the body 105. Although not depicted, the first and second leads 112, 114 may extend through respective first and second lead channels 144, 145 for connection the fusible link 104 and the circuit board.

Figure 2A:
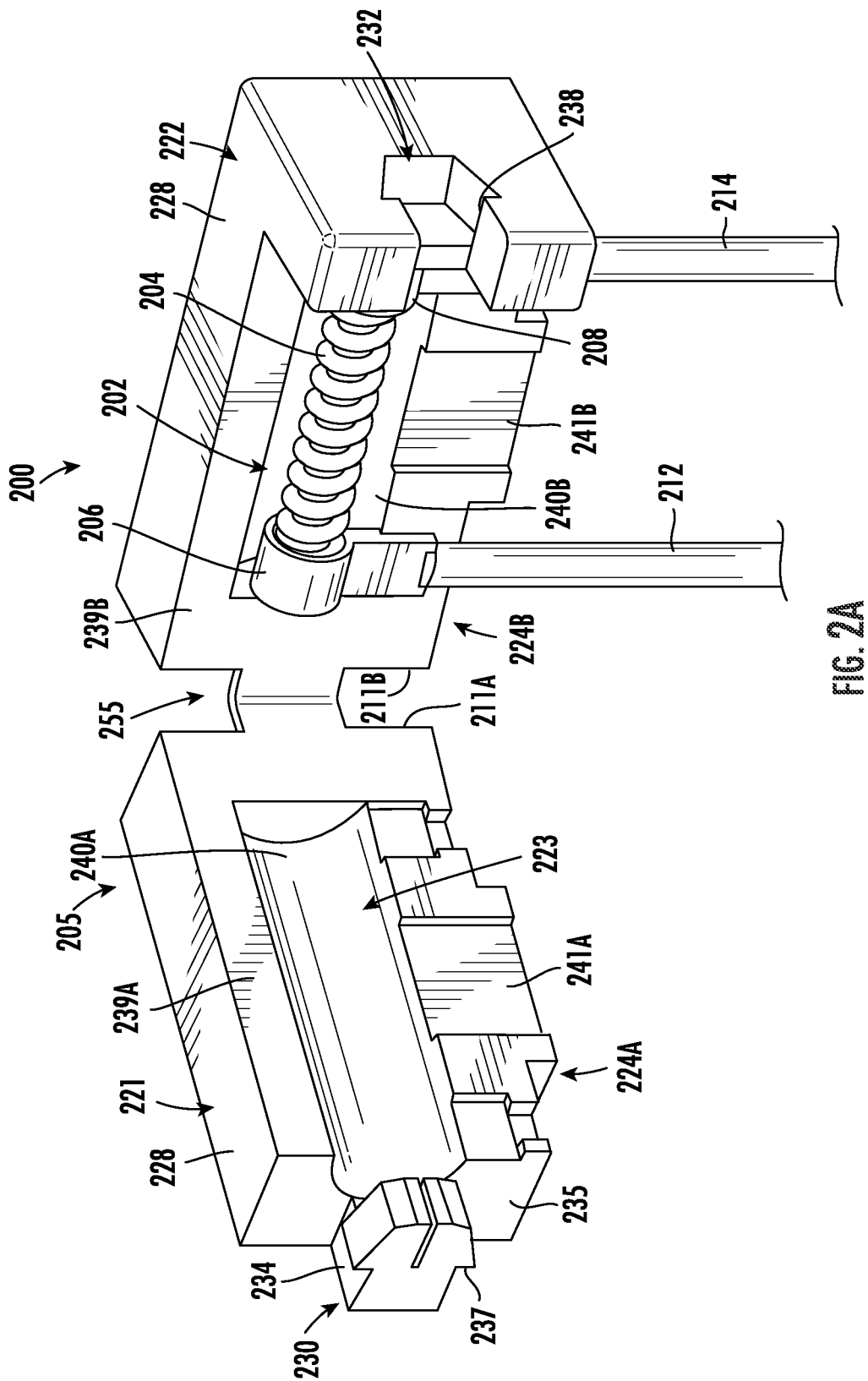
FIG. 2A depicts a perspective view of a protection device, including a body in an open configuration, according to embodiments of the present disclosure.
Figure 2C:
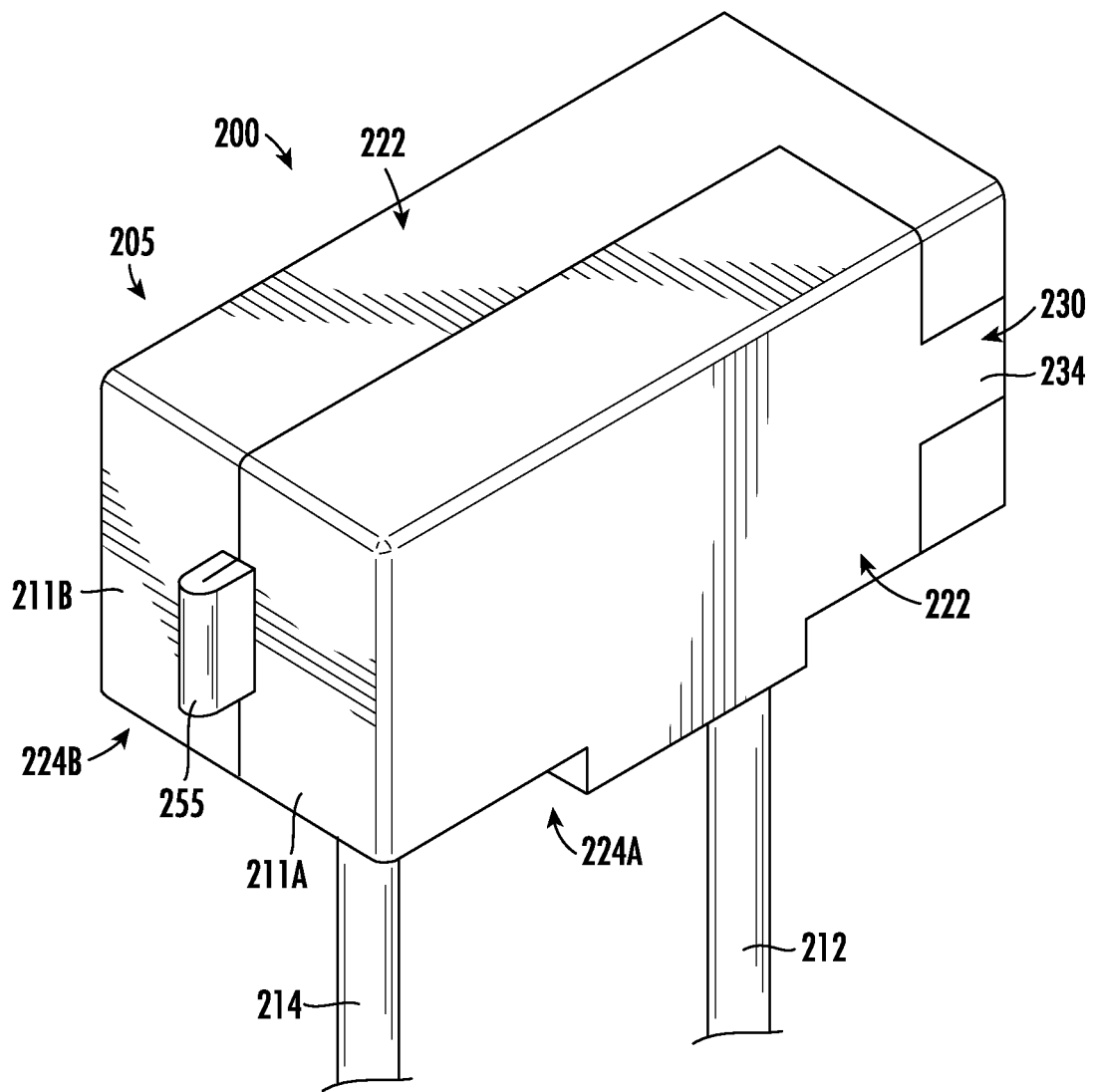
FIG. 2C depicts a perspective view of the protection device of FIG. 2A, including the body in a closed configuration, according to embodiments of the present disclosure.

Turning now to FIGS. 2A-2C, a protection device (hereinafter "device") 200 according to embodiments of the present disclosure will be described. It will be appreciated that the device 200 may share many or all the same features of the device 100 described above. As such, only certain aspects of the device 200 will hereinafter be described for the sake of brevity. As shown, the device 200 may include a fuse assembly 202 partially enclosed within a body 205, the fuse assembly 202 including a fusible link 204 extending between a first lead end 206 and a second lead end 208. A first lead 212 may extend from the first lead end 206 and a second lead 214 may extend from the second lead end 208.

The body 205 may include a first section 221 coupleable with a second section 222. In the embodiment shown, the first section 221 may include an engagement member 230 receivable within a corresponding engagement channel 232 of the second section 222. The opening of the engagement channel 232 may be sized and dimensioned to receive the engagement member 230 therein. More specifically, the engagement channel 232 may be shaped in a generally complementary manner with the outer surfaces of the engagement member 230. For example, the engagement member 230 may include a snap-fit attachment feature, latching feature, or other attachment features and techniques including, but not limited to, adhesives and other elements known in the art to provide secure attachment between the first and second sections 221, 222 once assembled.

As further shown, the engagement member 230 may include an arm 234 extending from an inner side wall 235 of the first section 221. As shown, the engagement member 230 may be a locking tab and the engagement channel 232 may be a locking cavity operable to retain the locking tab therein once joined. For example, the engagement member 230 may include a locking surface 237 operable to abut/engage a retention surface 238 of the engagement channel 232 to prevent the first and second sections 221, 222 from separating.

The first section 221 may further include an interior face 239A operable to engage a corresponding/opposite interior face 239B of the second section 222. A cavity surface 240A of the first section 221 and a cavity surface 240B of the second section 222 define the central cavity 223. A vent recess 241A of the first section 221 connects the central cavity 223 with an exterior surface 228 of the first section 221, e.g., along a bottom side 224A. Similarly, a vent recess 241B of the first section 222 connects the central cavity 223 with the exterior surface 228 of the second section 222, e.g., along a bottom side 224B.

In the embodiment shown, the first and second sections 221, 222 may be rotatably coupled together by a hinge 255 or other similarly connection means. The hinge 255 may extend from corresponding first ends 211A, 211B of the first section 221 and the second section 222, respectively. In some embodiments, the hinge 255 may be integrally formed with each of the first ends 211A, 211B. The hinge 255 permits the body 205 to move from the open configuration demonstrated in FIGS. 2A-2B to the closed configuration demonstrated in FIG. 2C.

Figure 3A:
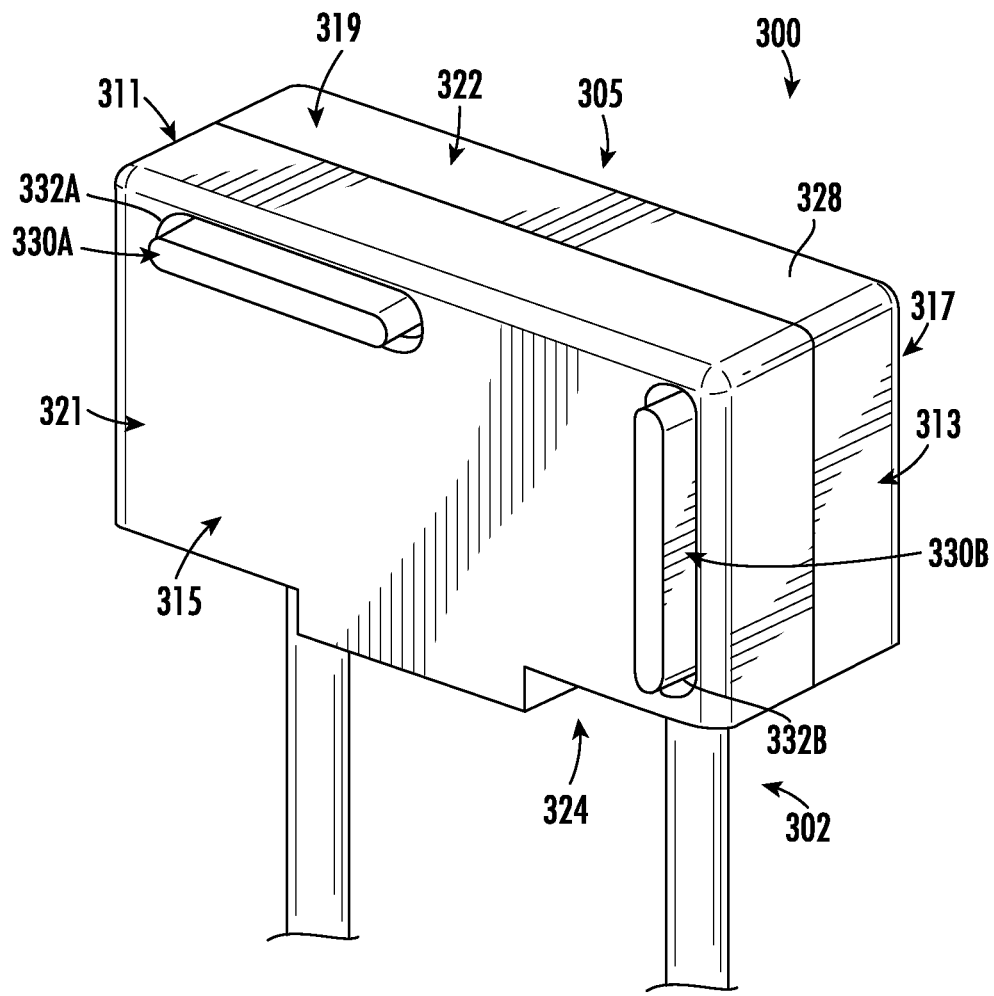
FIG. 3A depicts a perspective view of a protection device according to embodiments of the present disclosure.
Figure 3B:
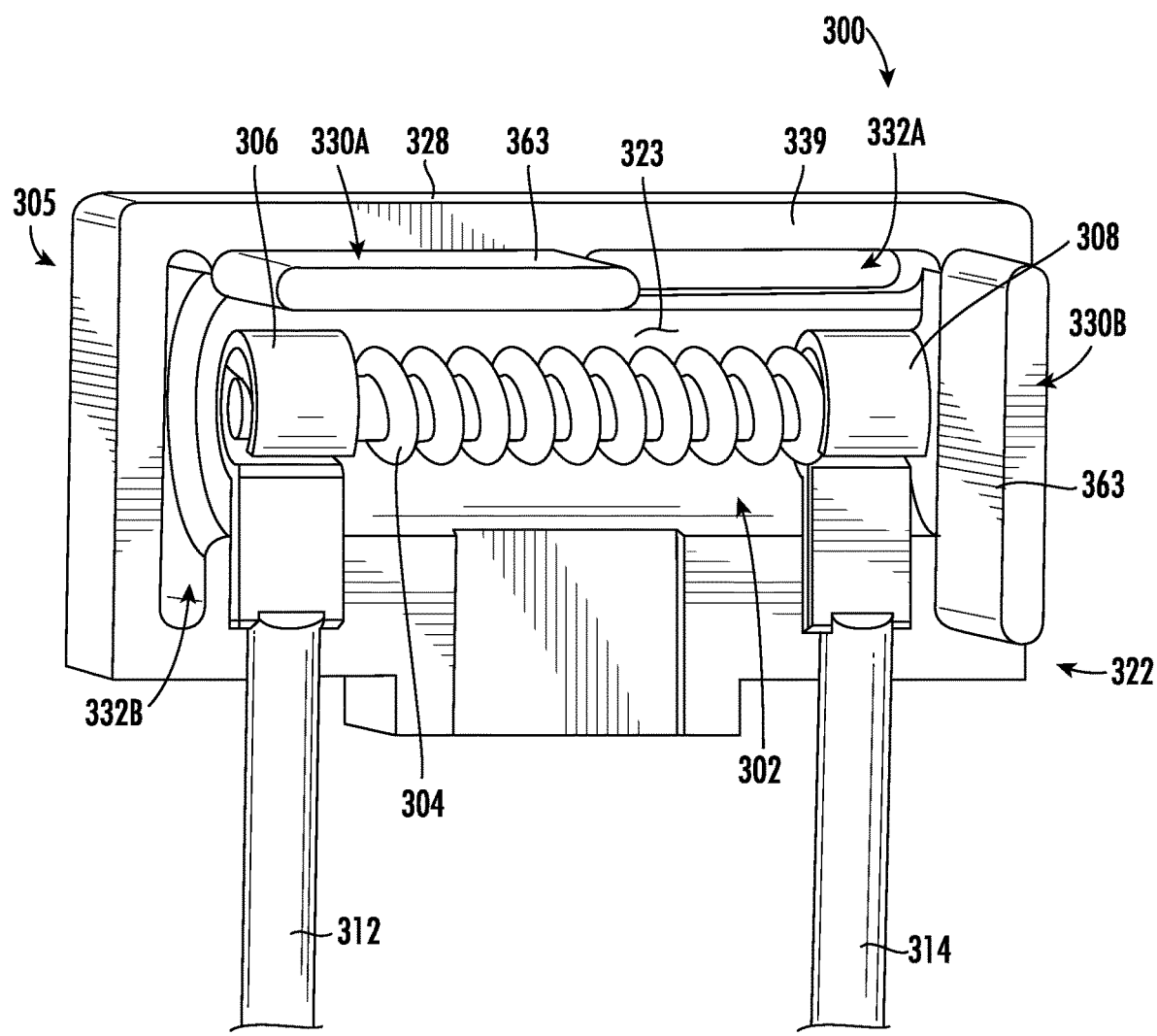
FIG. 3B depicts a perspective view of a portion of the protection device of FIG. 3A according to embodiments of the present disclosure.

Turning now to FIGS. 3A-3C, a protection device (hereinafter "device") 300 according to embodiments of the present disclosure will be described. It will be appreciated that the device 300 may share many or all the same features of the devices 100, 200 described above. As such, only certain aspects of the device 300 will hereinafter be described for the sake of brevity. As shown, the device 300 may include a fuse assembly 302 partially enclosed within a body 305, the fuse assembly 302 including a fusible link 304 extending between a first lead end 306 and a second lead end 308. A first lead 312 may extend from the first lead end 306 and a second lead 314 may extend from the second lead end 308.

The body 305 of the device 300 may include a first section 321 coupleable with a second section 322, wherein the first and second sections 321, 322 define a central cavity 323 housing the fusible link 304. In exemplary embodiments, the first and second sections 321, 322 may be identically/symmetrically shaped and configured. Once joined together, the first and second sections 321, 322 may form one or more planar exterior surfaces 328.

The first and second sections 321, 322 may each be fabricated from an injection molded, non-conductive material, such as plastic, into the shapes/configurations illustrated. Once joined, the body 305 may generally include a first end 311 opposite a second end 313, a first side 315 opposite a second side 317, and a top side 319 opposite a bottom side 324. As shown, the leads 312, 314 may extend through the bottom side 324 of the body 305.

In the embodiment shown, each of the first and second sections 321, 322 may include a first engagement member 330A received within a corresponding first engagement channel 332A of the opposite section, and a second engagement member 330B received within a corresponding second engagement channel 332B of the opposite section. Although not limited to any particular shape or quantity, the first and second engagement members 330A, 330B may be a set of tabs each having a one or more planar surfaces 363. In some embodiments, the first and second engagement members 330A, 330B may extend from an interior face 339 of each of the first and second sections 321, 322. The opening of the first and second engagement channels 332A, 332B may be sized and dimensioned to receive, respectively, the first and second engagement members 330A, 330B therein. In some embodiments, the first and second engagement members 330A, 330B and the first and second engagement channels 332A, 332B may be dimensioned to provide a slight interference fit when coupled.

As shown, the first and second engagement channels 332A, 332B may extend entirely through the body 305, e.g., between the interior face 339 and the exterior surface 328. In other embodiments, the first and second engagement channels 332A, 332B may extend only partially through the body 305. As best shown in FIG. 3A, when the first and second sections 321, 322 are joined together, the first and second engagement members 330A, 330B may extend beyond a plane defined by the external surface 328 extending along the first side 315 of the body 305. The protruding first and second engagement members 330A, 330B advantageously provide opportunities for heat-staking of the device 300.

As best shown in FIG. 3C, the second section 322 may further include a first lead channel 344 and a second lead channel 345 each extending between the central cavity 323 and the bottom side 324 of the body 305. Although non-limiting, each of the first and second lead channels 344, 345 may be defined in part by a main cavity surface 346, which is connected with a through cavity surface 347. As further shown, a vent recess 341 connects the central cavity 323 with the exterior surface 328 of the second section 322, e.g., along the bottom side 324.

When the fuse assembly 302 is engaged by the body 305, the main cavity surface 346 of the first and second lead channels 344, 345 may be engaged with a planar section of the first lead end 306 and the second lead end 308, respectively. The through cavity surface 347 may be engaged with an outer surface of first lead 312 and the second lead 314, respectively. A support shelf 348 of the first and second lead channels 344, 345 may engage a lower edge or surface of the planar section of the first and second lead ends 306, 308.

One or more sidewalls 349 adjacent the through cavity surface 347 may provide lateral support for the first and second leads 312, 314.

The engagement channel 332B may be further defined by a channel wall 355, which generally separates the engagement channel 332B from the internal cavity 323. In some embodiments, the channel wall 355 may include a channel wall surface 356 in abutment/contact with the engagement member 330B of the first section 321.

Figure 4A:
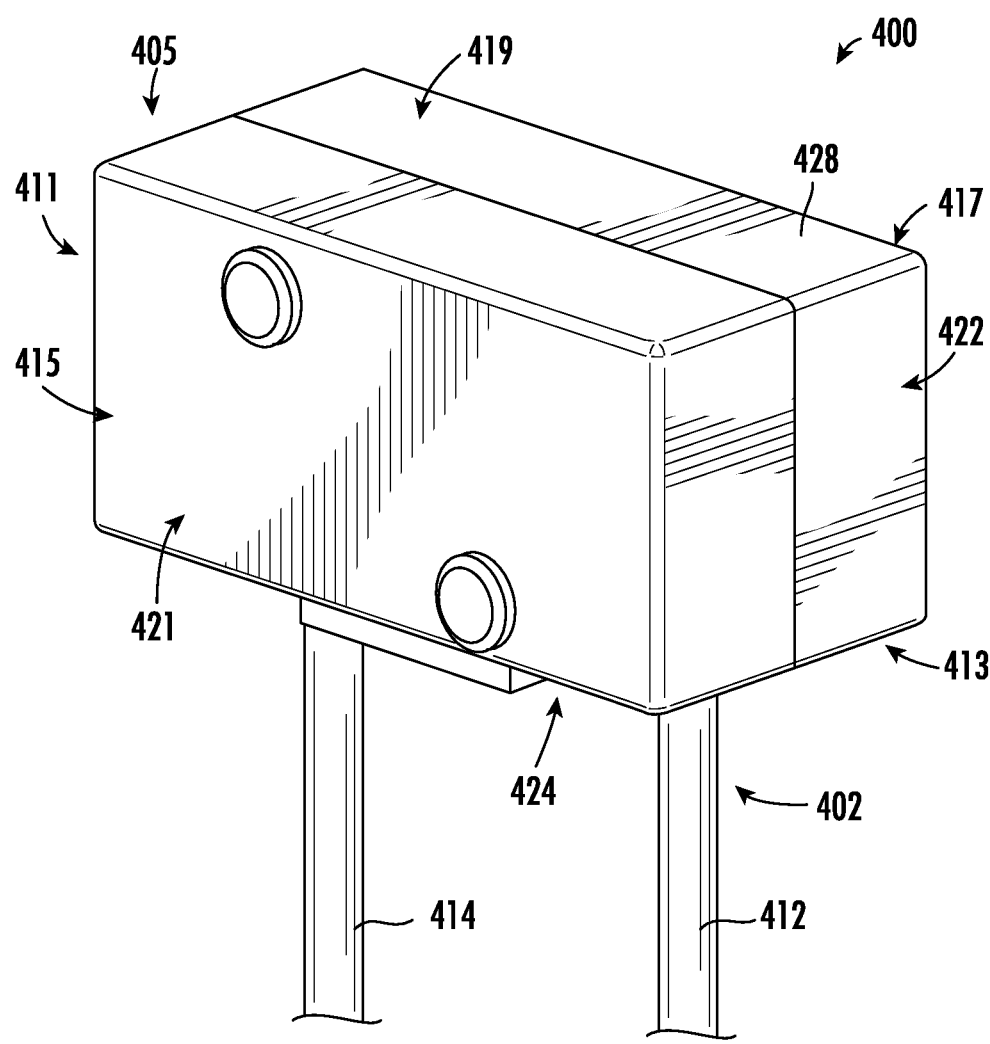
FIG. 4A depicts a perspective view of a protection device according to embodiments of the present disclosure.
Figure 4B:
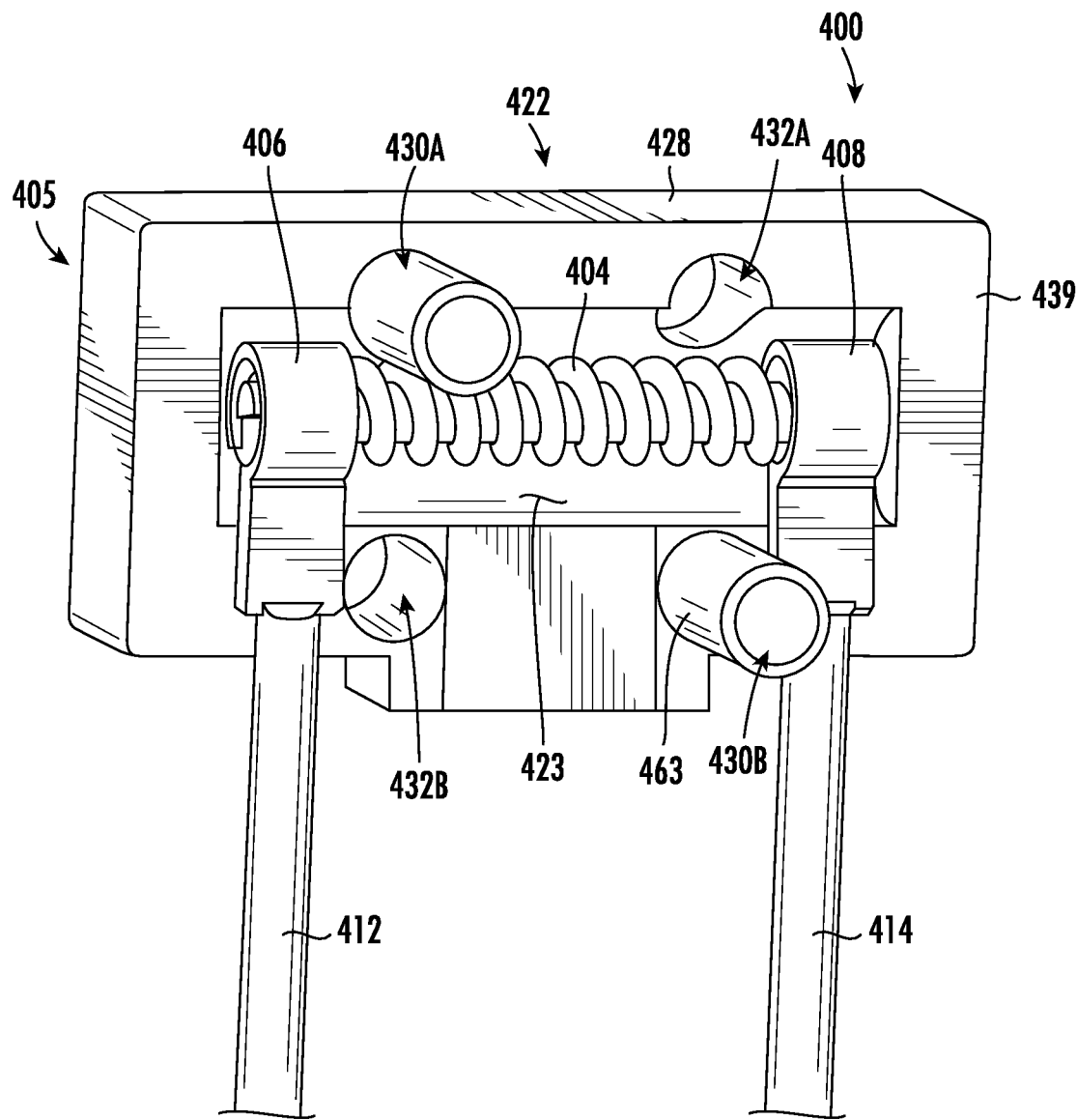
FIG. 4B depicts a perspective view of a portion of the protection device of FIG. 4A according to embodiments of the present disclosure.

Turning now to FIGS. 4A-4B, a protection device (hereinafter "device") 400 according to embodiments of the present disclosure will be described. It will be appreciated that the device 400 may share many or all the same features of the devices 100, 200, 300 described above. As such, only certain aspects of the device 400 will hereinafter be described for the sake of brevity. As shown, the device 400 may include a fuse assembly 402 partially enclosed within a body 405, the fuse assembly 402 including a fusible link 404 extending between a first lead end 406 and a second lead end 408. A first lead 412 may extend from the first lead end 406 and a second lead 414 may extend from the second lead end 408.

The body 405 of the device 400 may include a first section 421 coupleable with a second section 422, wherein the first and second sections 421, 422 define a central cavity 423 housing the fusible link 404. In exemplary embodiments, the first and second sections 421, 422 may be identically/symmetrically shaped and configured. Once joined together, the first and second sections 421, 422 may form one or more planar exterior surfaces 428. As shown, the body 405 may generally include a first end 411 opposite a second end 413, a first side 415 opposite a second side 417, and a top side 419 opposite a bottom side 424. As shown, the leads 412, 414 may extend through the bottom side 424 of the body 405.

In the embodiment shown, each of the first and second sections 421, 422 may include a first engagement member 430A received within a corresponding first engagement channel 432A of the opposite section, and a second engagement member 430B received within a corresponding second engagement channel 432B of the opposite section. Although not limited to any particular shape or quantity, the first and second engagement members 430A, 430B may be a set of cylindrical pegs or tabs, each having a rounded exterior surface 463. In some embodiments, the first and second engagement members 430A, 430B may extend from an interior face 439 of each of the first and second sections 421, 422. The opening of the engagement channels 432A, 432B may be sized and dimensioned to receive, respectively, the engagement members 430A, 430B therein. In some embodiments, the engagement members 430A, 430B and the engagement channels 432A, 432B may be dimensioned to provide a slight interference fit when coupled.

As shown, the engagement channels 432A, 432B may extend entirely through the body 405, e.g., between the interior face 439 and the exterior surface 428. In other embodiments, the engagement channels 432A, 432B may extend only partially through the body 405. As best shown in FIG. 4A, when the first and second sections 421, 422 are joined together, the engagement members 430A, 430B may extend beyond a plane defined by the first side 415 of the body 405. The protruding engagement members 430A, 430B advantageously provide opportunities for heat-staking of the device 400.

Figure 5A:
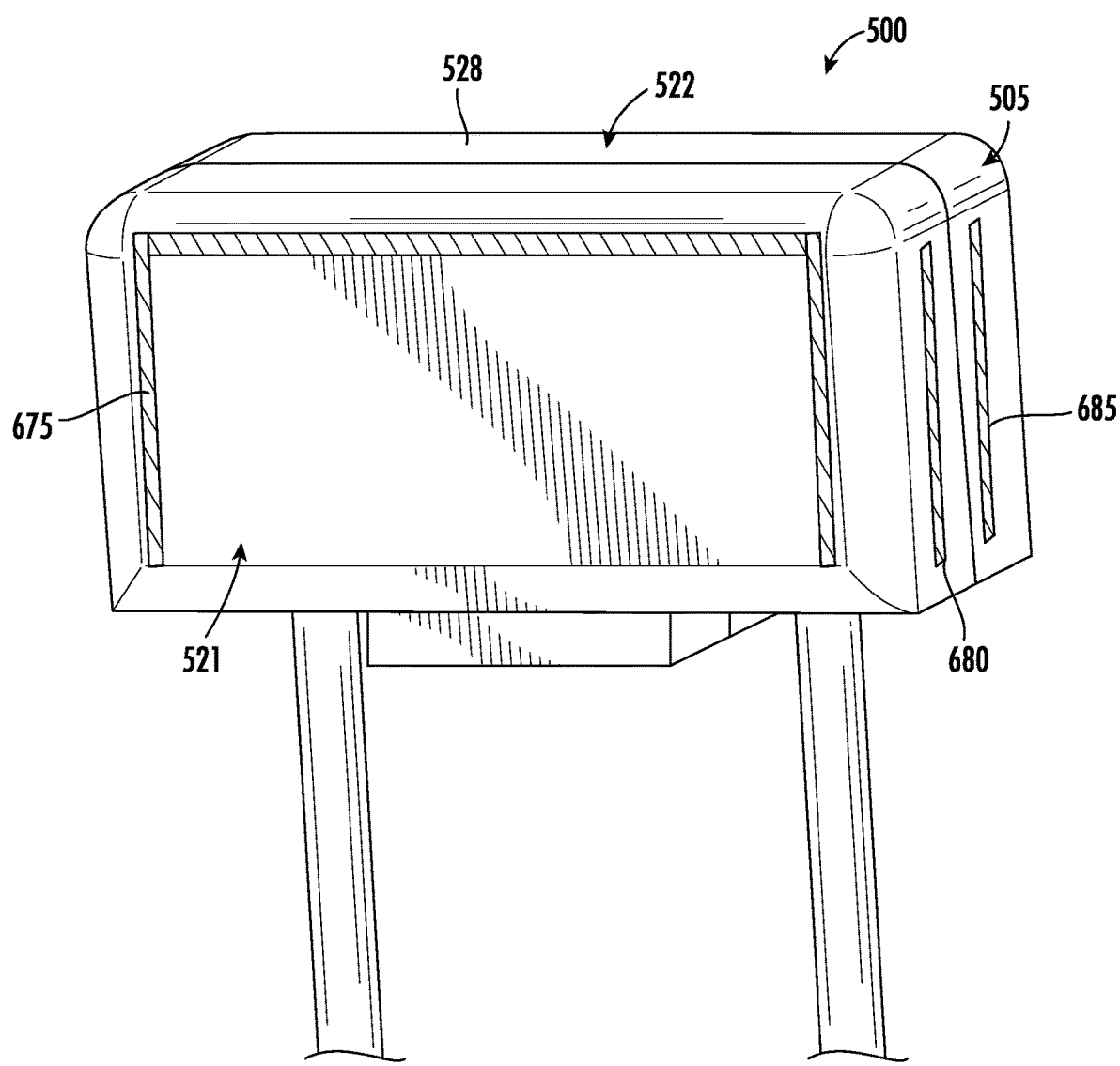
FIG. 5A depicts a perspective view of a protection device according to embodiments of the present disclosure.

Turning now to FIGS. 5A-5B, a protection device (hereinafter "device") 500 according to embodiments of the present disclosure will be described. It will be appreciated that the device 500 may share many or all the same features of the devices 100, 200, 300, 400 described above. As such, only certain aspects of the device 500 will hereinafter be described for the sake of brevity. As shown, the device 500 may include a fuse assembly 502 partially enclosed within a body 505.

The body 505 may include a first section 521 coupleable with a second section 522, wherein the first and second sections 521, 422 define a central cavity 523 housing a fusible link 504 of the fuse assembly 502. In exemplary embodiments, the first and second sections 521, 522 may be identically/symmetrically shaped and configured. Once joined together, the first and second sections 521, 522 may form one or more planar exterior surfaces 528.

As best shown in FIG. 5B, each of the first and second sections 521, 522 may include a first engagement member 530A received within a corresponding first engagement channel 532A of the opposite section, and a second engagement member 530B received within a corresponding second engagement channel 532B of the opposite section. Although not limited to any particular shape or quantity, the first and second engagement members 530A, 530B may be a set of tabs each having a set of planar surfaces 563 extending substantially perpendicular to one another. The opening of the first and second engagement channels 532A, 532B may be sized and dimensioned to receive, respectively, the first and second engagement members 530A, 530B therein. In some embodiments, the first and second engagement members 530A, 530B and the first and second engagement channels 532A, 532B may be dimensioned to provide a slight interference fit when coupled. As shown, the first and second engagement channels 532A, 532B may extend only partially through the body 505.

In some embodiments, the second engagement channel 532B may be defined by an inner wall 567, a channel wall 555, and a sidewall surface 568 of the first engagement member 530A. The second engagement member 530B may be in abutment/contact with the inner wall 567, the channel wall 555, and the sidewall surface 568. Meanwhile, the first engagement channel 532A may be defined by the planar surface 563 of the second engagement member 530B, a second sidewall surface 569 of the first engagement member 530A, and an underside 570 of an outer wall 572 generally defining a perimeter of the first and second sections 521, 522. The first engagement member 530A may be in abutment/contact with the planar surface 563 of the second engagement member 530B, the second sidewall surface 569 of the first engagement member 530A, and the underside 570 of the outer wall 572.

Figure 6:
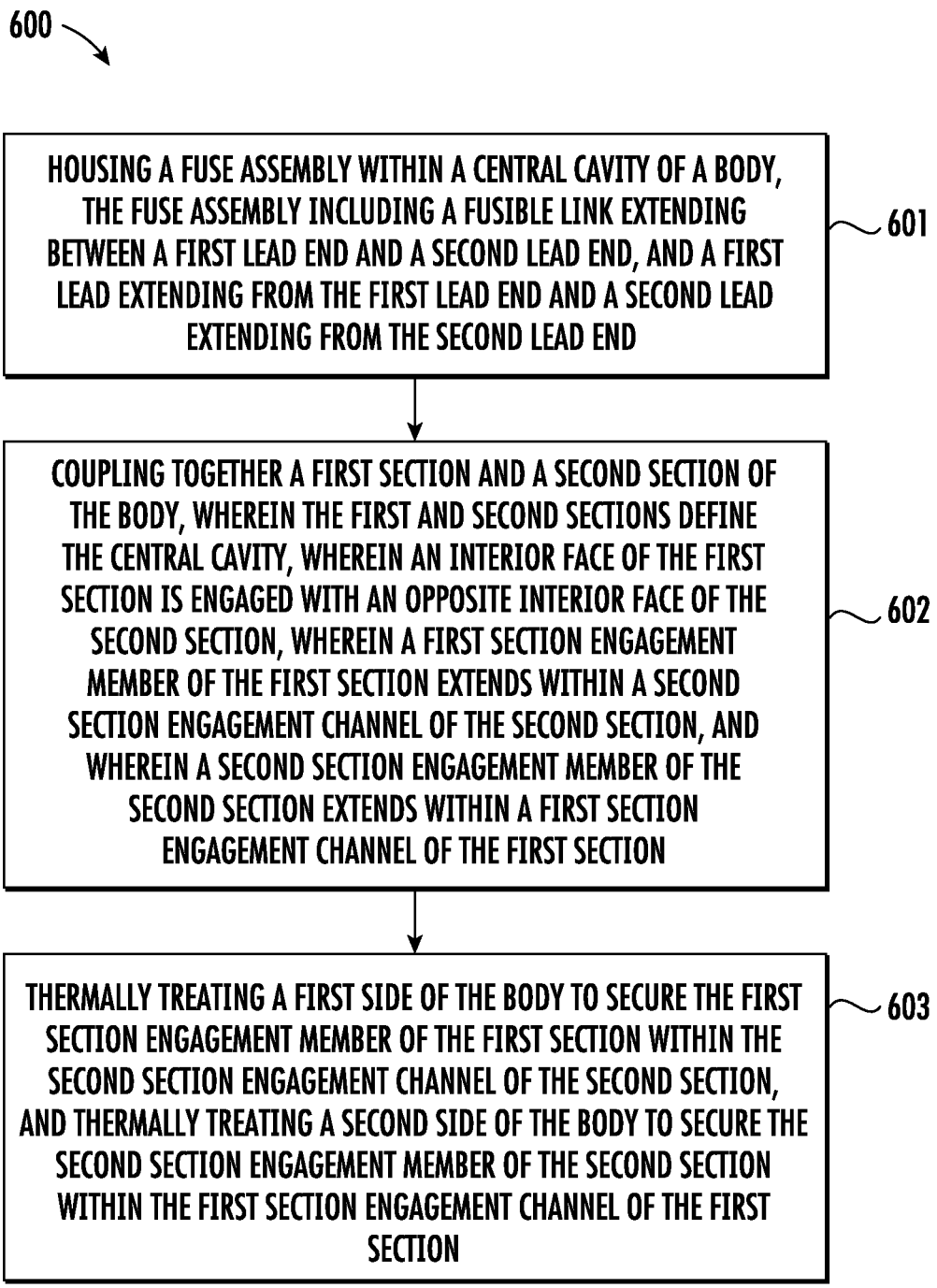
FIG. 6 is a process flow of a method according to embodiments of the present disclosure.

Turning now to FIG. 6, a method 600 for forming a protection device according to embodiments of the present disclosure is shown. At block 601, the method 600 may include housing a fuse assembly within a central cavity of a body, the fuse assembly including a fusible link extending between a first lead end and a second lead end, and a first lead extending from the first lead end and a second lead extending from the second lead end. In some embodiments, the fuse assembly may be a radial fuse assembly including a helically shaped fusible link extending around a center rod.

At block 602, the method 600 may include coupling together a first section and a second section of the body, wherein the first and second sections define the central cavity, wherein an interior face of the first section is engaged with an opposite interior face of the second section, wherein a first section engagement member of the first section extends within a second section engagement channel of the second section, and wherein a second section engagement member of the second section extends within a first section engagement channel of the first section.

In some embodiments, the method 600 may further include extending another first section engagement member of the first section through another second section engagement channel of the second section, and extending another second section engagement member of the second section extends through another first section engagement channel of the first section.

In some embodiments, the method 600 may include providing a thermal vent between the central cavity and an exterior surface of the body, and providing a first lead channel and a second lead channel on opposite sides of the thermal vent, wherein each of the first and second lead channels extends between the central cavity and the exterior surface, and wherein the first lead end of the fuse assembly is engaged with a surface defining the first lead channel and the second lead end of the fuse assembly is engaged with a second surface defining the second lead channel.

At optional block 603, the method 600 may include thermally treating a first side of the body to secure the first section engagement member of the first section within the second section engagement channel of the second section, and thermally treating a second side of the body to secure the second section engagement member of the second section within the first section engagement channel of the first section. For example, the thermal treatment is represented in FIG. 5A by areas 675, 680, 685 extending along the exterior surface(s) 528 of the device 500. Said differently, areas 675, 680, and 685 correspond to sections where a laser beam may be focused to melt portions of the body 505 for the purpose of further securing the first and second sections 521, 522 together. It will be appreciated that areas 675, 680, and 685 are representative only, and that a variety of heat-staking areas and approaches may be employed.

Figure 7A:
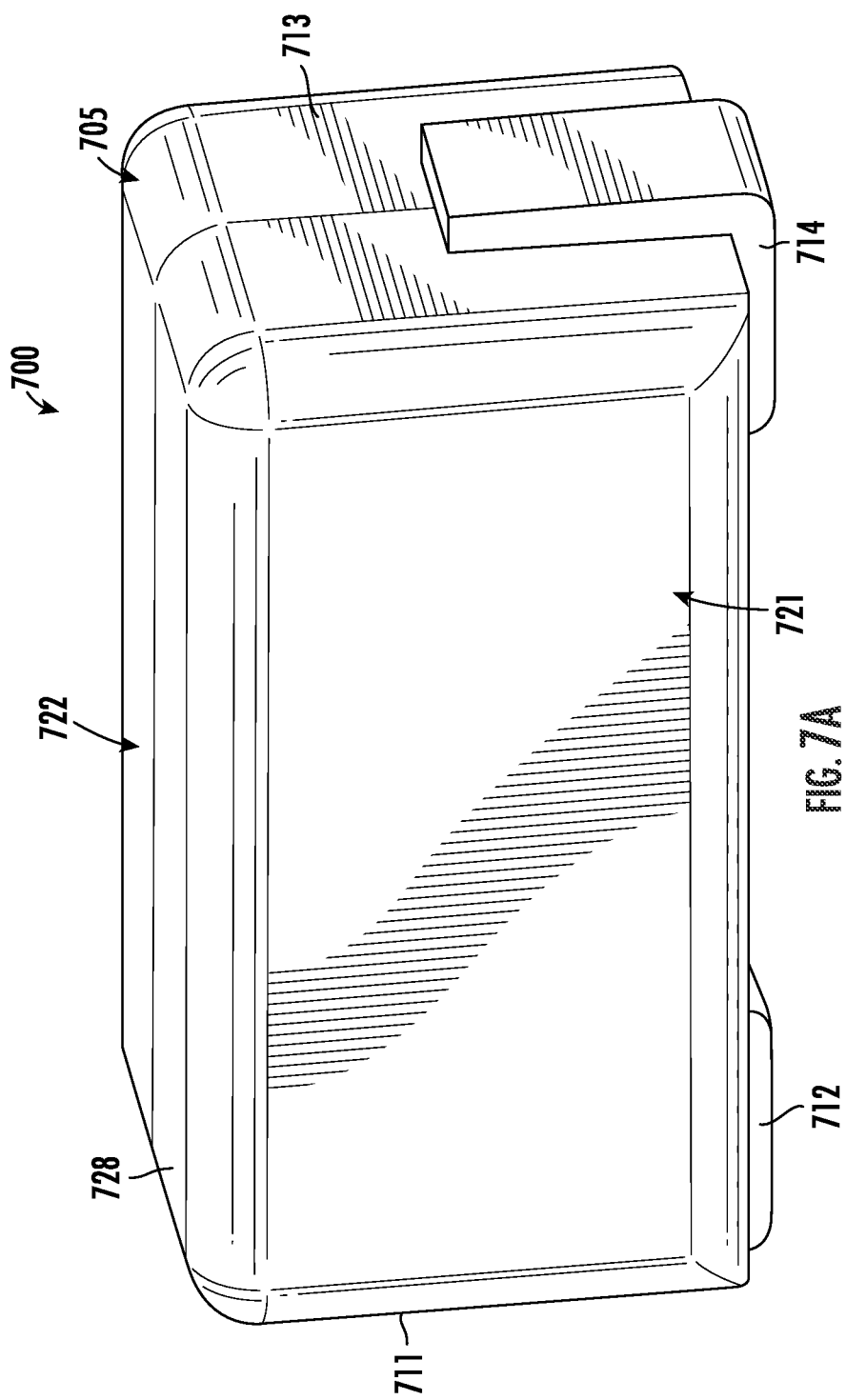
FIG. 7A depicts a perspective view of a protection device according to embodiments of the present disclosure.
Figure 7B:
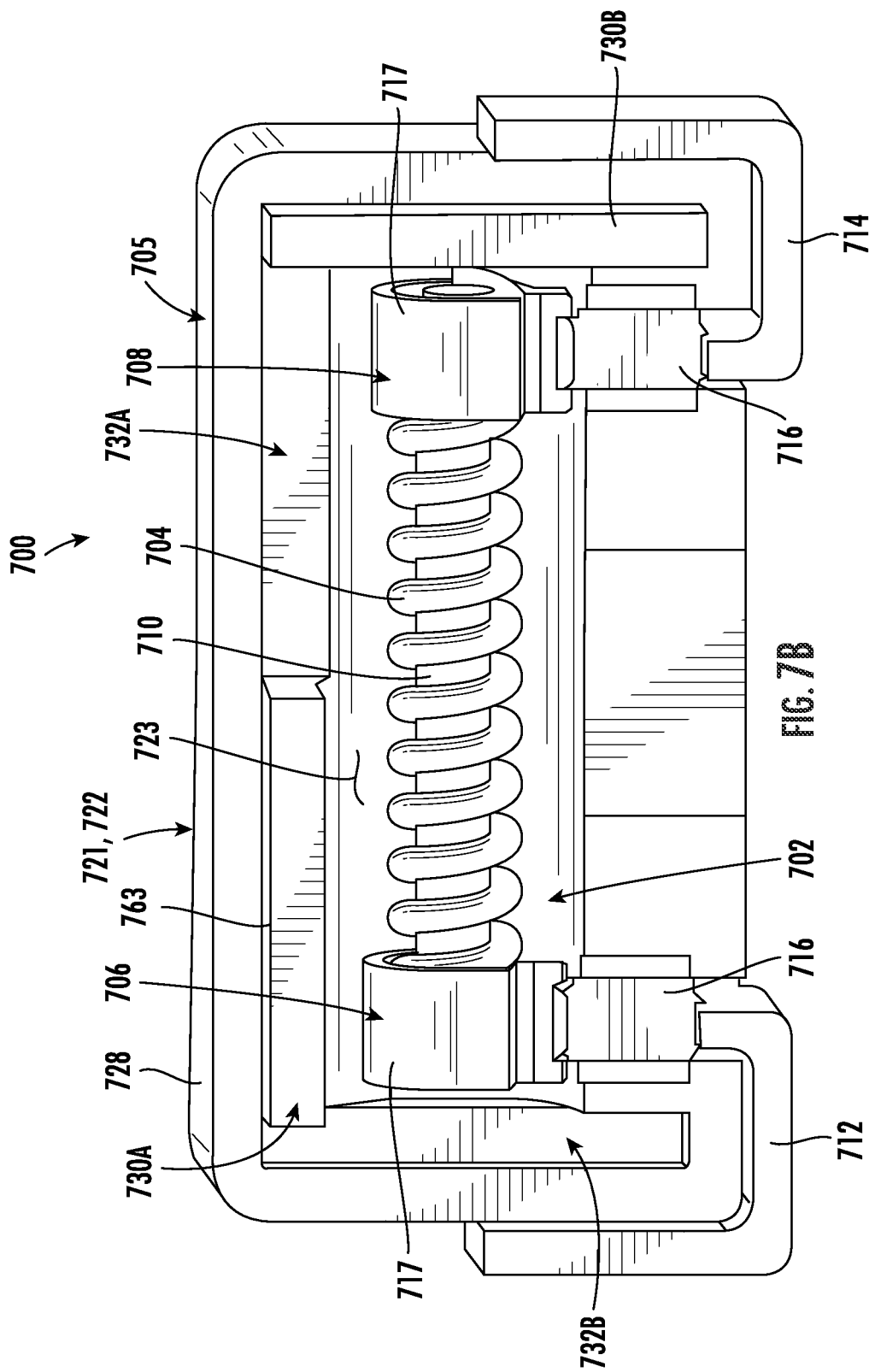
FIG. 7B depicts a perspective view of a portion of the protection device of FIG. 7A according to embodiments of the present disclosure.

FIGS. 7A-7B depict a protection device (hereinafter "device") 700 according to embodiments of the present disclosure. In this embodiment, the protection device 700 may be a surface mount fuse device. As shown, the device 700 may include a fuse assembly 702 partially enclosed within a body 705, the fuse assembly 702 including a fusible link 704 extending between a first lead end 706 and a second lead end 708. In some embodiments, the fusible link 704 may be helical element extending around a center rod 710. A first end of the fusible link 704 may be in direct physical and electrical contact with the first lead end 706, while a second end of the fusible link 704 may be in direct physical and electrical contact with the second lead end 708. A first lead (or terminal) 712 may extend from the first lead end 706 and a second lead (or terminal) 714 may extend from the second lead end 708. As shown, the first lead 712 may wrap around the body 705, extending along a surface of a first end 711. Similarly, the second lead 714 may extend along a surface of a second end 713.

In some embodiments, the first and second lead ends 706, 708 may include a planar section 716 and a curved section 717, which is bent or otherwise shaped into a rounded eyelet shape into which the fusible link 704 and the center rod 710 may be fitted. Optionally, once the fusible link 704 is inserted into each curved section 717, the ends may be bent further around the first and second ends of the fusible link 704 such that the fusible link 704 is positively captured or secured to the first and second lead ends 706, 708. The fusible link 704 and the first and second lead ends 706, 708 may then be soldered together to complete a mechanical and electrical connection therebetween.

As further shown, the body 705 of the device 100 may include a first section 721 coupleable with a second section 722, wherein the first and second sections 721, 722 define a central cavity 723 housing the fusible link 704. In exemplary embodiments, the first and second sections 721, 722 may be identically/symmetrically shaped and configured to decrease machine and part complexity and cost. Once joined together, the first and second sections 721, 722 may form one or more planar exterior surfaces 728.

As best shown in FIG. 7B, each of the first and second sections 721, 722 may include a first engagement member 730A received within a corresponding first engagement channel 732A of the opposite section, and a second engagement member 730B received within a corresponding second engagement channel 732B of the opposite section. Although not limited to any particular shape or quantity, the first and second engagement members 730A, 730B may be a set of tabs each having a set of planar surfaces 763 extending substantially perpendicular to one another. The opening of the first and second engagement channels 732A, 732B may be sized and dimensioned to receive, respectively, the first and second engagement members 570A, 730B therein. In some embodiments, the first and second engagement members 730A, 730B and the first and second engagement channels 732A, 732B may be dimensioned to provide a slight interference fit when coupled. As shown, the first and second engagement channels 732A, 532B may extend only partially through the body 705. In other embodiments, the first and second engagement channels 732A, 732B may extend entirely through the body 705.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A protection device, comprising:
   a fuse assembly comprising:
   a fusible link extending between a first lead end and a second lead end; and
   a first lead extending from the first lead end and a second lead extending from the second lead end; and
   a body comprising a first section coupleable with a second section, wherein the first and second sections define a central cavity housing the fusible link, wherein the first section comprises:
   an interior face operable to engage an opposite interior face of the second section;
   an engagement member extending away from the interior face towards the second section, wherein the engagement member extends beyond a plane defined by an outermost exterior surface of the second section of the body; and
   an engagement channel adjacent the engagement member, the engagement channel operable to receive a corresponding engagement member of the second section.

2. The protection device of claim 1, the body further comprising a thermal vent extending between the central cavity and an exterior surface of the body.

3. The protection device of claim 2, the body further comprising a first lead channel and a second lead channel each extending between the central cavity and the exterior surface, wherein the first lead end is engaged with a surface defining the first lead channel and the second lead end is engaged with a second surface defining the second lead channel.

4. The protection device of claim 2, the first section of the body further comprising:
   a second engagement member extending away from the interior face towards the second section, wherein the second engagement member extends beyond the plane defined by the outermost exterior surface of the second section of the body; and
   a second engagement channel adjacent the second engagement member, the second engagement channel operable to receive a corresponding second engagement member of the second section.

5. The protection device of claim 4, wherein the first engagement channel and the second engagement channel extend entirely through the first section of the body, between the interior face and the outermost exterior surface of the second section of the body.

6. The protection device of claim 4, wherein the first engagement member and the second engagement member are tabs oriented perpendicular to one another.

7. The protection device of claim 2, wherein the first and second leads wrap around the exterior surface of the body.

8. A protection device body, comprising:
a first section; and
a second section couplable to the first section, wherein the first and second sections define a central cavity operable to house a fusible link of a fuse assembly, and wherein the first section comprises:
an interior face operable to engage an opposite interior face of the second section;
an engagement member extending away from the interior face towards the second section; and
an engagement channel adjacent the engagement member, the engagement channel operable to receive a corresponding engagement member of the second section, wherein the engagement member is a locking tab, wherein the engagement channel is a locking cavity operable to receive the locking tab, wherein the locking tab comprises a set of compression members separated by a slit, and wherein each of the set of compression members includes a sloped surface to enable entry of the locking tab into the locking cavity.

9. The protection device body of claim 8, the body further comprising:
a thermal vent extending between the central cavity and an exterior surface of the body; and
a first lead channel and a second lead channel each extending between the central cavity and the exterior surface, wherein the first and second lead channels are positioned on opposite sides of the thermal vent, and wherein the first lead channel is operable to receive a first lead end of the fuse assembly and the second lead channel is operable to receive a second lead end of the fuse assembly.

10. The protection device body of claim 9, the second section of the body comprising:
a second engagement member extending away from the interior face towards the first section; and
a second engagement channel adjacent the second engagement member, the second engagement channel operable to receive the first engagement member of the first section, wherein the second engagement member is a locking tab, wherein the second engagement channel is a locking cavity operable to receive the locking tab, wherein the locking tab comprises a set of compression members separated by a slit, and wherein each of the set of compression members includes a sloped surface to enable entry of the locking tab into the locking cavity.

11. The protection device body of claim 10, wherein the first and second leads wrap around the exterior surface of the body.

12. A method, comprising:
housing a fuse assembly within a central cavity of a body, the fuse assembly comprising:
a fusible link extending between a first lead end and a second lead end; and
a first lead extending from the first lead end and a second lead extending from the second lead end;
coupling together a first section and a second section of the body, wherein the first and second sections define the central cavity, wherein an interior face of the first section is engaged with an opposite interior face of the second section, wherein a first section engagement member of the first section extends within a second section engagement channel of the second section, wherein the first section engagement member extends beyond a plane defined by an outermost exterior surface of the second section of the body, and wherein a second section engagement member of the second section extends within a first section engagement channel of the first section.

13. The method of claim 12, further comprising:
providing a thermal vent between the central cavity and an exterior surface of the body; and
providing a first lead channel and a second lead channel on opposite sides of the thermal vent, wherein each of the first and second lead channels extends between the central cavity and the exterior surface, and wherein the first lead end of the fuse assembly is engaged with a surface defining the first lead channel and the second lead end of the fuse assembly is engaged with a second surface defining the second lead channel.

14. The method of claim 13, further comprising:
extending another first section engagement member of the first section through another second section engagement channel of the second section; and
extending another second section engagement member of the second section extends through another first section engagement channel of the first section.

15. The method of claim 13, further comprising:
thermally treating a first side of the body to secure the first section engagement member of the first section within the second section engagement channel of the second section; and
thermally treating a second side of the body to secure the second section engagement member of the second section within the first section engagement channel of the first section.

* * * * *